(12) United States Patent
Przyborowski

(10) Patent No.: US 12,489,410 B2
(45) Date of Patent: Dec. 2, 2025

(54) COMMON-MODE FEEDBACK

(71) Applicant: Nordic Semiconductor ASA, Trondheim (NO)

(72) Inventor: Dominik Przyborowski, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 442 days.

(21) Appl. No.: 18/027,363

(22) PCT Filed: Sep. 22, 2021

(86) PCT No.: PCT/EP2021/076105
§ 371 (c)(1),
(2) Date: Mar. 20, 2023

(87) PCT Pub. No.: WO2022/063849
PCT Pub. Date: Mar. 31, 2022

(65) Prior Publication Data
US 2023/0387874 A1    Nov. 30, 2023

(30) Foreign Application Priority Data
Sep. 22, 2020   (GB) ..................... 2014963

(51) Int. Cl.
*H03F 3/45* (2006.01)
*H03F 1/34* (2006.01)

(52) U.S. Cl.
CPC ......... *H03F 3/45663* (2013.01); *H03F 1/342* (2013.01); *H03F 3/45183* (2013.01);
(Continued)

(58) Field of Classification Search
CPC .. H03F 3/45663; H03F 1/342; H03F 3/45183; H03F 2200/261;
(Continued)

(56) References Cited

U.S. PATENT DOCUMENTS

| 2003/0001674 A1* | 1/2003 | Nagaraj ............. H03F 3/45704 330/258 |
| 2004/0227572 A1 | 11/2004 | Takata et al. |
| 2018/0212577 A1 | 7/2018 | Kelly et al. |

OTHER PUBLICATIONS

Choi et al., "High-Frequency CMOS Switched-Capacitor Filters for Communications Application," *IEEE Journal of Solid-State Circuits*, vol. SC-18, No. 6, Dec. 1983, pp. 652-664.

(Continued)

*Primary Examiner* — Andrea Lindgren Baltzell
*Assistant Examiner* — Khiem D Nguyen
(74) *Attorney, Agent, or Firm* — Klarquist Sparkman, LLP

(57) ABSTRACT

A common-mode feedback circuit for a fully differential amplifier comprises first ($M_B$), second ($M_{TP}$), and third ($M_{TN}$) transistors, each having a respective drain, source, gate, and back-gate terminals. The drain terminal of the first transistor ($M_B$) and the gate terminals of the first, second, and third transistors ($M_B$, $M_{TP}$, $M_{TN}$) are connected together at a bias current terminal. The drain terminals of the second and third transistors are connected together at a tail current terminal. The source terminals of the first, second, and third transistors are connected together. The back-gate terminal of the first transistor ($M_B$) is arranged to receive a common-mode reference voltage input ($V_{CM}$), the back-gate terminal of the second transistor ($M_{TP}$) is arranged to receive a positive output voltage ($V_P$) from the fully differential amplifier, and the back-gate terminal of the third transistor ($M_{TN}$) is arranged to receive a negative output voltage ($V_N$) from the fully differential amplifier.

9 Claims, 4 Drawing Sheets

(52) U.S. Cl.
CPC .............. *H03F 2200/261* (2013.01); *H03F 2203/45134* (2013.01)

(58) Field of Classification Search
CPC ....... H03F 2203/45134; H03F 2200/24; H03F 2200/555; H03F 2203/45002; H03F 2203/45004; H03F 2203/45014; H03F 2203/45072; H03F 2203/45082; H03F 2203/45406; H03F 2203/45431; H03F 2203/45451; H03F 2203/45471; H03F 2203/45486; H03F 2203/45508; H03F 3/4565; H03F 3/45475
USPC ....................................................... 330/258
See application file for complete search history.

(56) References Cited

OTHER PUBLICATIONS

International Search Report and Written Opinion for PCT/EP2021/076105, mailed Dec. 21, 2021, 13 pages.
IPO Search Report under Section 17(5) for GB2014963.9, dated Mar. 15, 2021, 3 pages.

\* cited by examiner

COMMON-MODE FEEDBACK

CROSS REFERENCE TO RELATED APPLICATIONS

This is the U.S. National Stage of International Application No. PCT/EP2021/076105, filed Sep. 22, 2021, which was published in English under PCT Article 21 (2), which in turn claims the benefit of Great Britain Application No. 2014963.9, filed Sep. 22, 2020.

TECHNICAL FIELD

The present invention relates to a common-mode feedback circuit, and a fully differential amplifier that uses the same, that may provide power savings and/or reductions in circuit area.

BACKGROUND OF THE INVENTION

Many electronic devices, in particular radio transceiver devices (i.e. radio transmitters and/or receivers), include a fully differential amplifier. Those skilled in the art will appreciate that a fully differential amplifier is a voltage amplifier (typically with high gain) that is provided with differential inputs and differential outputs.

Typically, the fully differential amplifier is arranged with feedback that almost completely determines the differential output voltage for any given differential input voltage.

A differential amplifier is usually constructed from transistors arranged in a differential pair configuration, where the differential input voltage is applied across the gate terminals of the differential pair transistors, and the output voltage is dependent on the differential input voltage, multiplied by the differential-mode gain of the amplifier. In a fully differential amplifier, the output voltage itself is also differential, such that the voltage differential across the output terminals is (typically) proportional to the voltage differential across the input terminals.

In general, a fully differential amplifier requires bias circuitry that provides a bias current to the amplifier. This bias circuitry may also include common-mode feedback (CMFB) circuitry, that forms a common-mode feedback loop. This CMFB circuit measures the common-mode voltage at the output of the amplifier, compares the measured common-mode voltage to a reference value (which may be zero), and provides feedback to adjust the current supplied to the amplifier which, in turn, drives the common-mode voltage toward the reference value. It will be appreciated that the 'common-mode voltage' is typically a DC voltage that is common to both input terminals, and is equal to the average of the voltages at the input terminals of the amplifier. Generally, it is preferable to have this common-mode voltage constant and well-defined.

Typically, the differential pair of transistors is arranged in a 'long-tailed pair', where the 'tail current' is the biasing current supplied through the differential pair transistors. Typically, this 'tail current' is derived from an externally supplied bias current (e.g. from a current source), where the bias current is modulated by the CMFB circuit to generate the appropriate tail current to achieve the target common-mode output voltage.

There are a number of CMFB circuits suitable for use with fully differential amplifiers that are known in the art per se. One such arrangement is introduced in 'High-Frequency CMOS Switched-Capacitor Filters for Communications Application' (Tat C. Choi, Ronald T. Kaneshiro, Robert W. Brodersen, Paul R. Gray, William B. Jett, Milton Wilcox; IEEE Journal of Solid-State Circuits, Vol. 18, No. 6, December 1983). As is outlined in further detail below with reference to FIG. 2, in that arrangement a current mirror (i.e. a pair of transistors connected in a current mirror configuration) is connected to an arrangement of three further transistors that form the common-mode feedback loop.

These three transistors are typically biased in their respective deep triode region, resulting in a very low intrinsic gain of these devices. Additionally, such a conventional arrangement requires at least five transistors (the two for the current mirror, plus the three for the common-mode feedback loop). In general, the number of transistors used has a significant impact on the power consumed by the device, as well as requiring more area on silicon.

It will be appreciated that, depending on the nomenclature in use, the 'common-mode feedback circuit' may be referred to as a part of a 'fully differential amplifier', or it may be referred to as a separate arrangement connected to the 'fully differential amplifier'. For the avoidance of doubt, these terms are used herein such that the 'fully differential amplifier' refers to the components that act to take a differential input and produce a differential output that depends on the input and excludes the CMFB circuit; and such that the term 'common-mode feedback circuit' refers to the components that alter the bias current supplied to the fully differential amplifier.

SUMMARY OF THE INVENTION

When viewed from a first aspect, the present invention provides a common-mode feedback circuit for a fully differential amplifier, said common-mode feedback circuit comprising first, second, and third transistors, each having a respective drain terminal, source terminal, gate terminal, and back-gate terminal, wherein the common mode feedback circuit is arranged such that:
  the drain terminal of the first transistor and the gate terminals of the first, second, and third transistors are connected together at a bias current terminal;
  the drain terminals of the second and third transistors are connected together at a tail current terminal; and
  the source terminals of the first, second, and third transistors are connected together;
  wherein the back-gate terminal of the first transistor is arranged to receive a common-mode reference voltage input, the back-gate terminal of the second transistor is arranged to receive a positive output voltage from the fully differential amplifier, and the back-gate terminal of the third transistor is arranged to receive a negative output voltage from the fully differential amplifier.

The first aspect of the invention extends to an electronic device comprising a fully differential amplifier connected to the common-mode feedback circuit outlined above.

Thus embodiments of the first aspect of the invention also provide an electronic device comprising a fully differential amplifier and a common-mode feedback circuit, the fully differential amplifier comprising:
  a positive input terminal and a negative input arranged to receive a differential input voltage thereacross;
  a positive output terminal and a negative output terminal, wherein the fully differential amplifier is arranged to produce a differential output voltage across said output terminals, wherein said differential output voltage is at least partially dependent on said differential input voltage; and a supply current terminal arranged to receive a tail current for biasing the fully differential amplifier;

wherein the common-mode feedback circuit comprises first, second, and third transistors, each having a respective drain terminal, source terminal, gate terminal, and back-gate terminal, wherein the common mode feedback circuit is arranged such that:

the drain terminal of the first transistor and the gate terminals of the first, second, and third transistors are connected together at a bias current terminal;

the drain terminals of the second and third transistors are connected together at a tail current terminal arranged to supply the tail current to the supply current terminal of the differential amplifier; and the source terminals of the first, second, and third transistors are connected together;

wherein the back-gate terminal of the first transistor is arranged to receive a common-mode reference voltage input, the back-gate terminal of the second transistor is connected to the positive output voltage terminal, and the back-gate terminal of the third transistor is connected to the negative output voltage terminal.

The electronic device may comprise a radio communication device (i.e. a radio receiver, transmitter, or transceiver). Thus the first aspect of the invention extends to a radio communication device comprising the fully differential amplifier and common-mode feedback circuit outlined above.

Thus it will be appreciated that embodiments of the present invention provide an arrangement in which fewer transistors are required in order to provide the CMFB to the fully differential amplifier. In particular, only three transistors are required instead of five, as per the prior art CMFB arrangement discussed above. While further transistors could be provided in some embodiments, the CMFB functionality is achieved through use of the back-gate terminals of the first, second, and third transistors.

In particular, the CMFB of the present arrangement is arranged such that if the common-mode component of the voltage output of the fully differential amplifier (i.e. if the average of the positive and negative output voltages from the fully differential amplifier) to which it is connected (or connectable) is approximately equal to the common-mode reference voltage input, the conductance of the two tail transistors (i.e. the 'second' and 'third' transistors) is maximised, and thus the tail current supplied to the fully differential amplifier is maximised (i.e. the common-mode feedback loop is at its most conductive). However, if the common-mode output of the fully differential amplifier deviates from the common-mode reference voltage input, the threshold voltages of the two tail transistors will increase due to the resulting reverse back bias. This, in turn, reduces the conductance of the second and third transistors, thereby reducing the tail current supplied to the differential pair within the fully differential amplifier. This reduction in current leads to a reduction in the common-mode voltage.

This simplifies the CMFB circuitry compared to prior art arrangements. Due to the arrangement requiring fewer transistors, power savings can be achieved because power consumption generally scales with the number of transistors. Additionally, the CMFB circuit of the present invention may require less area on silicon than the conventional CMFB arrangements discussed previously.

Furthermore, the arrangement provided by embodiments of the present invention has the CMFB loop controlled by devices that are biased in pentode region which may ensure higher loop gain for wide range of values for the common-mode voltage $V_{CM}$ and the positive and negative output voltages, $V_P$ and $V_N$ respectively. The use of the back-gate terminals provides this high loop gain for a wide range of biasing and signal amplitude conditions.

The wide linear range that is achievable with the present invention may allow a fully differential amplifier provided with the present CMFB arrangement to be 'common-mode insensitive' for large differential signal amplitudes. This may advantageously improve common-mode rejection for large signals, for example in a radio receive intermediate frequency (IF) chain. Such an arrangement may also improve the performance of stages in the chain preceding an analogue-to-digital converter (ADC) with respect to 'kick-back' noise from the ADC.

Those skilled in the art will appreciate that the transistors are 'four-terminal' devices. The gate, drain, and source terminals behave in a manner conventional of the majority of transistors. The fourth 'back-gate' terminal (sometimes referred to as a 'body', 'bulk', or 'substrate' terminal) is an additional terminal that is connected to the substrate of the device. The voltage applied to this back-gate terminal—referred to as 'back-biasing' or 'body-biasing' the device—varies the threshold voltage of the transistor.

There are a number of transistor technologies that provide this back-gate terminal and thus allow for back-biasing of the transistors. However, in a preferred set of embodiments, the first, second, and third transistors comprise fully depleted semiconductor-on-insulator (FDSOI) transistors. Unlike conventional bulk complementary metal-oxide-semiconductor (CMOS) technology in which devices are manufactured from silicon substrates, 'silicon-on-insulator' (SOI) devices are manufactured from layers of silicon stacked on an insulating layer, typically silicon dioxide or sapphire. SOI devices can be manufactured through 'partial depletion' (PDSOI) or 'full depletion' (FDSOI), where 'partial' and 'full' refer to the degree to which the depletion region extends through the bulk of the device. SOI enables the usage of transistor back bias and which may provide for a reduction in transistor leakage or make transistors faster, depending on the type of back bias in use. A forward back bias may lead to faster transistors (but that leak more) whereas a reverse back bias may lead to transistors leaking less (but that are slower).

In at least some such embodiments, the transistors comprise ultra-thin body and buried oxide (UTBB) fully depleted silicon-on-insulator (or UTBB-FDSOI) transistors. Those skilled in the art will appreciate that so-called UTBB-FDSOI devices are a recent development in semiconductor devices, having a back-gate terminal as above, where the UTBB devices provide yet finer control over the threshold voltage of the transistor to provide a high level of tunability.

It will be appreciated that the transistors generally come in either 'p-type' or 'n-type' variations, depending on the doping of the transistor substrates. Preferably the first, second, and third transistors are of the same type (i.e. they are all p-type or all n-type). In a particular set of embodiments, the first, second, and third transistors comprise n-type transistors (i.e. they are 'NMOS' devices).

In some embodiments, the bias current terminal is connected to a bias current supply, which in some embodiments may comprise a current source such as a constant current source. This bias current supply provides a source of current which is then modulated by the CMFB circuitry to drive the common-mode voltage of the connected fully differential amplifier (i.e. when the CMFB circuit is connected to the amplifier) to the target value. The bias current supply may form part of the CMFB circuit, part of the fully differential amplifier, or may be an external component (e.g. another part of the radio communication device or other application, as appropriate).

The common-mode reference input to which the common-mode output of the fully differential amplifier is compared may be a static value or may be variable. Generally, the common-mode reference input is externally supplied, e.g. by a reference voltage generator. Such a generator may, in some embodiments, be provided within the electronic device, and may form a part of the fully differential amplifier or CMFB in some arrangements.

BRIEF DESCRIPTION OF THE DRAWINGS

Certain embodiments of the present invention will now be described with reference to the accompanying drawings, in which.

DETAILED DESCRIPTION

Figure 1:
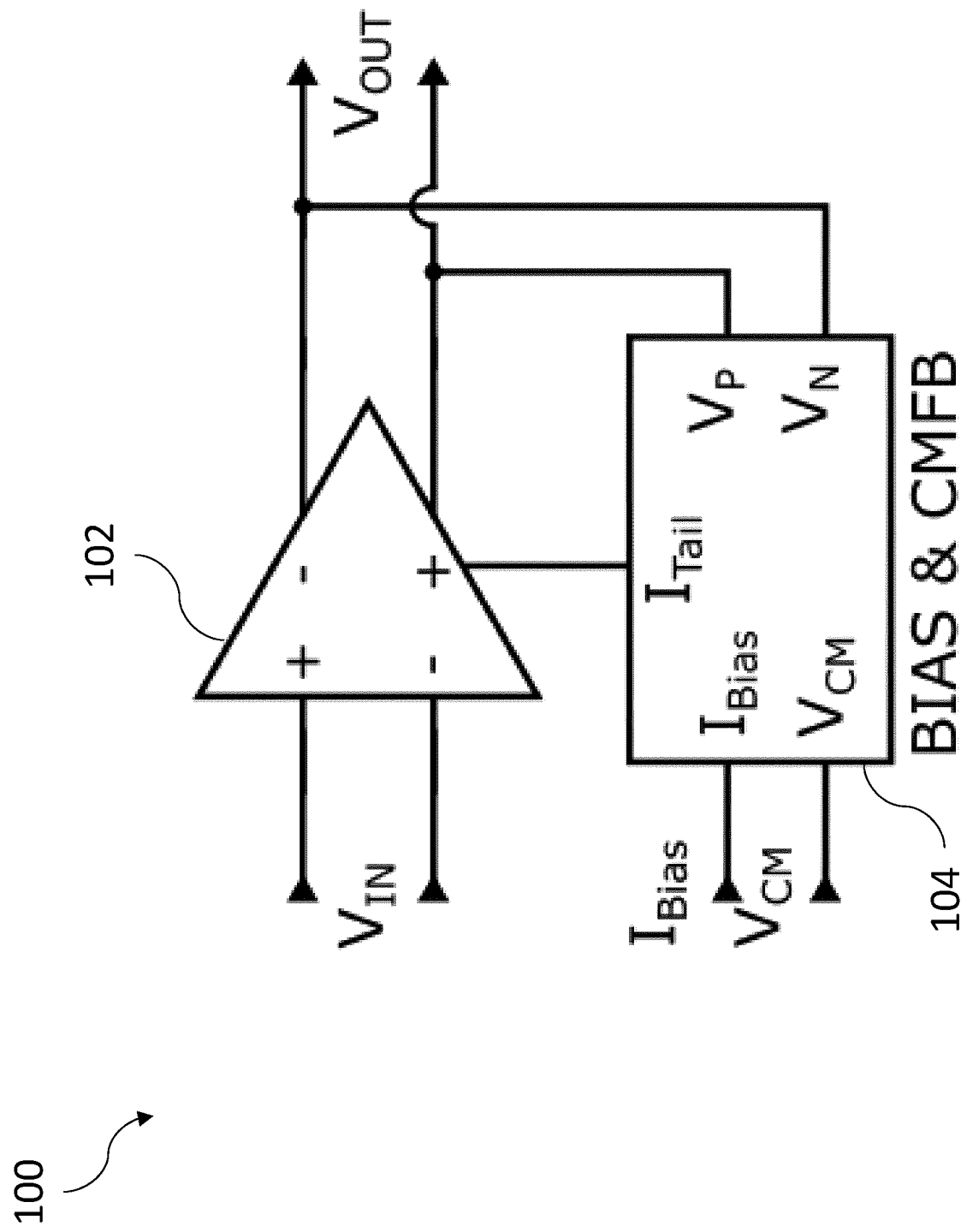
FIG. 1 is a block diagram of a fully differential amplifier with common-mode feedback.

FIG. 1 is a block diagram of a prior art electronic device 100 that includes a fully differential amplifier 102 provided with a common-mode feedback circuit (CMFB) 104.

The fully differential amplifier 102 has a positive input terminal and a negative input terminal and is arranged to receive a differential input voltage $V_{IN}$ across these input terminals. The amplifier has an associated differential-mode gain $G_{DM}$, which is ideally high, and an associated common-mode gain $G_{CM}$, which is ideally zero (or as low as possible).

The differential input voltage $V_{IN}$ is amplified by the differential-mode gain $G_{DM}$ to produce a differential output voltage $V_{OUT}$ across the negative and positive output terminals of the fully differential amplifier 102.

In general the differential output voltage $V_{OUT\_DM}$ is equal to the difference between the positive input voltage $V_{IN+}$ (i.e. the voltage at the positive input terminal) and the negative input voltage $V_{IN-}$ (i.e. the voltage at the negative input terminal), multiplied by the differential-mode gain $G_{DM}$, as per Equation 1 below:

$$V_{OUT\_DM} = G_{DM}(V_{IN+} - V_{IN-}) \quad (1)$$

Differential-mode output voltage of amplifier

The common-mode gain $G_{CM}$ acts to amplify the average value of the input voltages, i.e. the common-mode component of the output voltage $V_{OUT\_CM}$ is equal to the sum of the positive input voltage $V_{IN+}$ and the negative input voltage $V_{IN-}$, divided by two, and multiplied by the common-mode gain $G_{CM}$, as per Equation 2 below:

$$V_{OUT\_CM} = G_{CM} \frac{(V_{IN+} + V_{IN-})}{2} \quad \text{Equation 2}$$

Common-mode output voltage of amplifier

The CMFB 104 receives a bias current $I_{Bias}$ from an external current source (not shown). The CMFB 104 also receives a positive voltage $V_P$ and a negative voltage $V_N$ from the fully differential amplifier 102. In this particular example, these voltages are the positive and negative output voltages of the fully differential amplifier 102 themselves, however alternative arrangements in which the inputs to the CMFB 104 are instead be derived from the output of the fully differential amplifier 102 are envisaged.

Depending on the common-mode voltage (which can be determined from the average of the positive voltage $V_P$ and the negative voltage $V_N$) received from the fully differential amplifier 102 and how it compares to an externally supplied set point or 'reference' voltage $V_{CM}$, the CMFB 104 varies a tail current $I_{Tail}$ that is supplies the fully differential amplifier 102, where generally this tail current $I_{Tail}$ is supplied to transistors arranged in a differential pair configuration within the fully differential amplifier 102 in a manner well known in the art per se.

Figure 2:
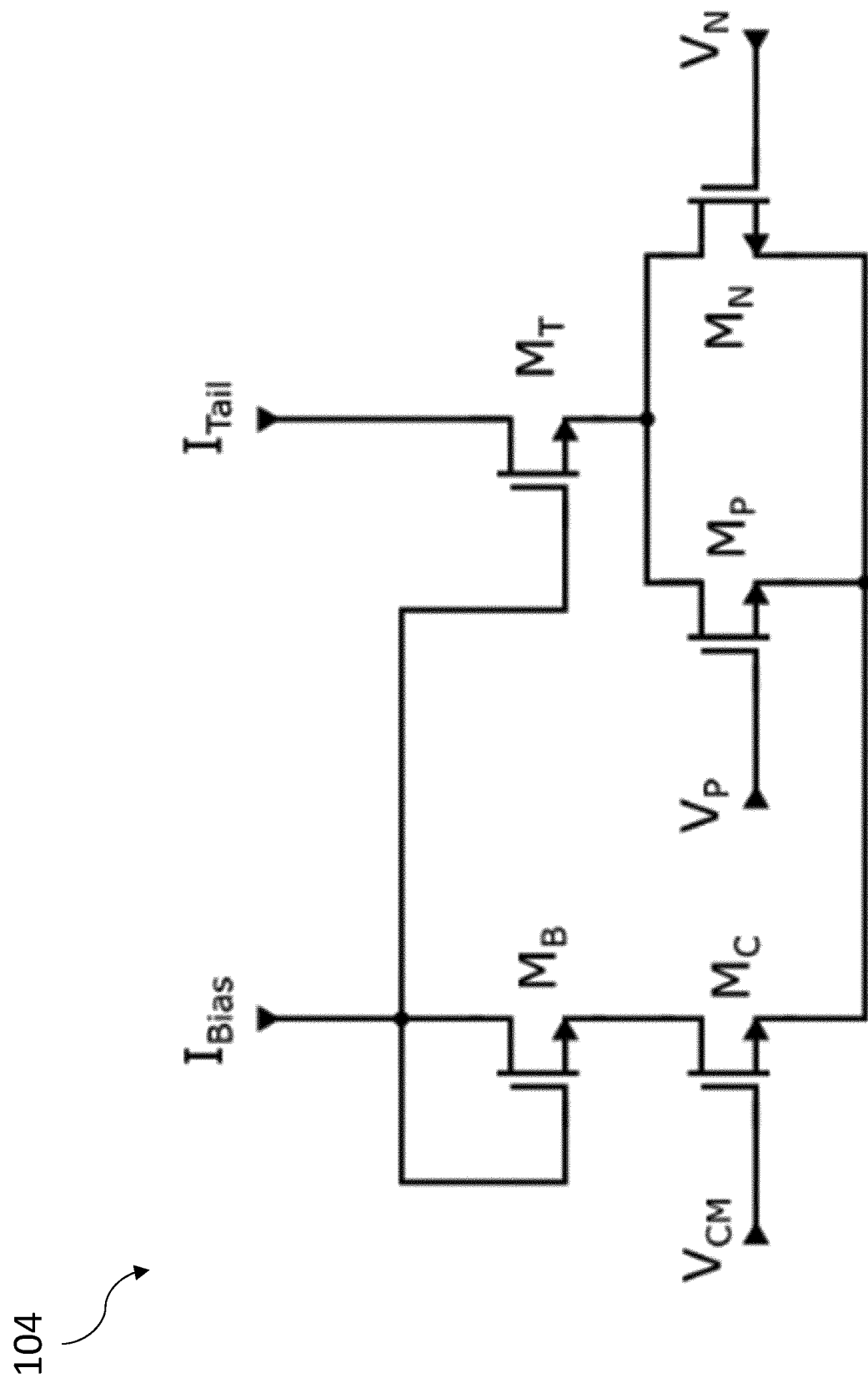
FIG. 2 is a schematic diagram of a prior art common-mode feedback circuit.

A prior art arrangement used for the CMFB 104 can be seen in FIG. 2, which is a schematic diagram of the CMFB 104 used with the fully differential amplifier 102 of FIG. 1.

As can be seen in FIG. 2, the CMFB 104 is constructed from five transistors: a bias transistor $M_B$, common-mode reference transistor $M_C$, tail transistor $M_T$, positive input transistor $M_P$, and negative input transistor $M_N$. The bias transistor $M_B$ and the tail transistor $M_T$ are arranged to form a current mirror, such that the current that flows through the bias transistor $M_B$ is 'reflected' through the tail transistor $M_T$. This is achieved through having the bias transistor $M_B$ in a 'diode-connected' configuration, where its gate and drain terminals are connected together. The gate terminal of the tail transistor $M_T$ is connected to the gate and drain terminals of the bias transistor $M_B$. The drain terminal (and the gate terminal) of the bias transistor is connected to the external current source and the bias current $I_{Bias}$ passes through the bias transistor $M_B$ as if it were a diode.

A common-mode reference voltage input $V_{CM}$ is applied to the gate terminal of the common-mode reference transistor $M_C$. This externally supplied common-mode reference voltage input $V_{CM}$ acts as a 'set point', i.e. it is the value to which the common-mode voltage at the output of the fully differential amplifier 102 is driven towards. The magnitude of the current through the bias transistor $M_B$ depends on the reference voltage $V_{CM}$ applied to the gate terminal of the common-mode reference transistor $M_C$. By controlling the conductance of the common-mode reference transistor $M_C$, the total current flowing through the bias transistor $M_B$, and thus through the tail transistor $M_T$, can be controlled— though the current actually supplied by to the fully differential amplifier 102 is subject to further modulation by the common-mode feedback loop, as outlined below.

The drain terminal of the tail transistor $M_T$ is connected to the fully differential amplifier 102 and acts to supply the tail current $I_{Tail}$ to the internal differential pair transistors within the fully differential amplifier 102. However, the tail current $I_{Tail}$ is not simply a copy of $I_{Bias}$, but instead depends on the values of the output voltages $V_P$ and $V_N$ (i.e. the outputs of the fully differential amplifier 102) which are applied to the gate terminals of the positive input transistor $M_P$ and negative input transistor $M_N$ respectively.

This arrangement results in the common-mode reference transistor $M_C$, positive input transistor $M_P$, and negative input transistor $M_N$ being biased in the triode region which causes these transistors to act like resistors. This results in a relatively low intrinsic gain of these devices. Additionally, due to the requirement for five transistors, the CMFB 104 of FIG. 2 typically consumes more power and requires more area on silicon than may otherwise be achieved using the arrangement of FIG. 3, as outlined below.

Figure 3:
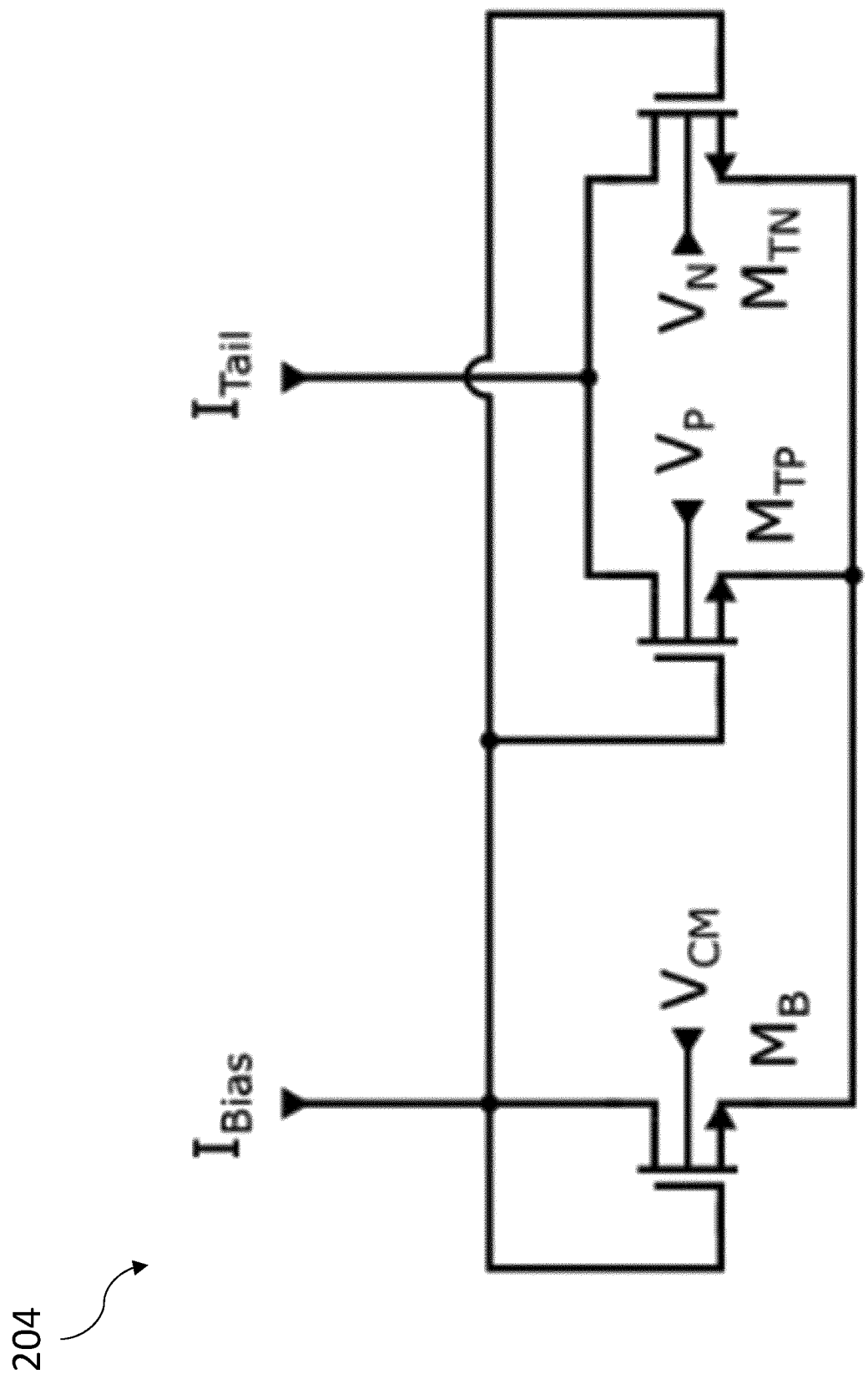
FIG. 3 is a schematic diagram of a common-mode feedback circuit in accordance with an embodiment of the present invention.
Figure 4:
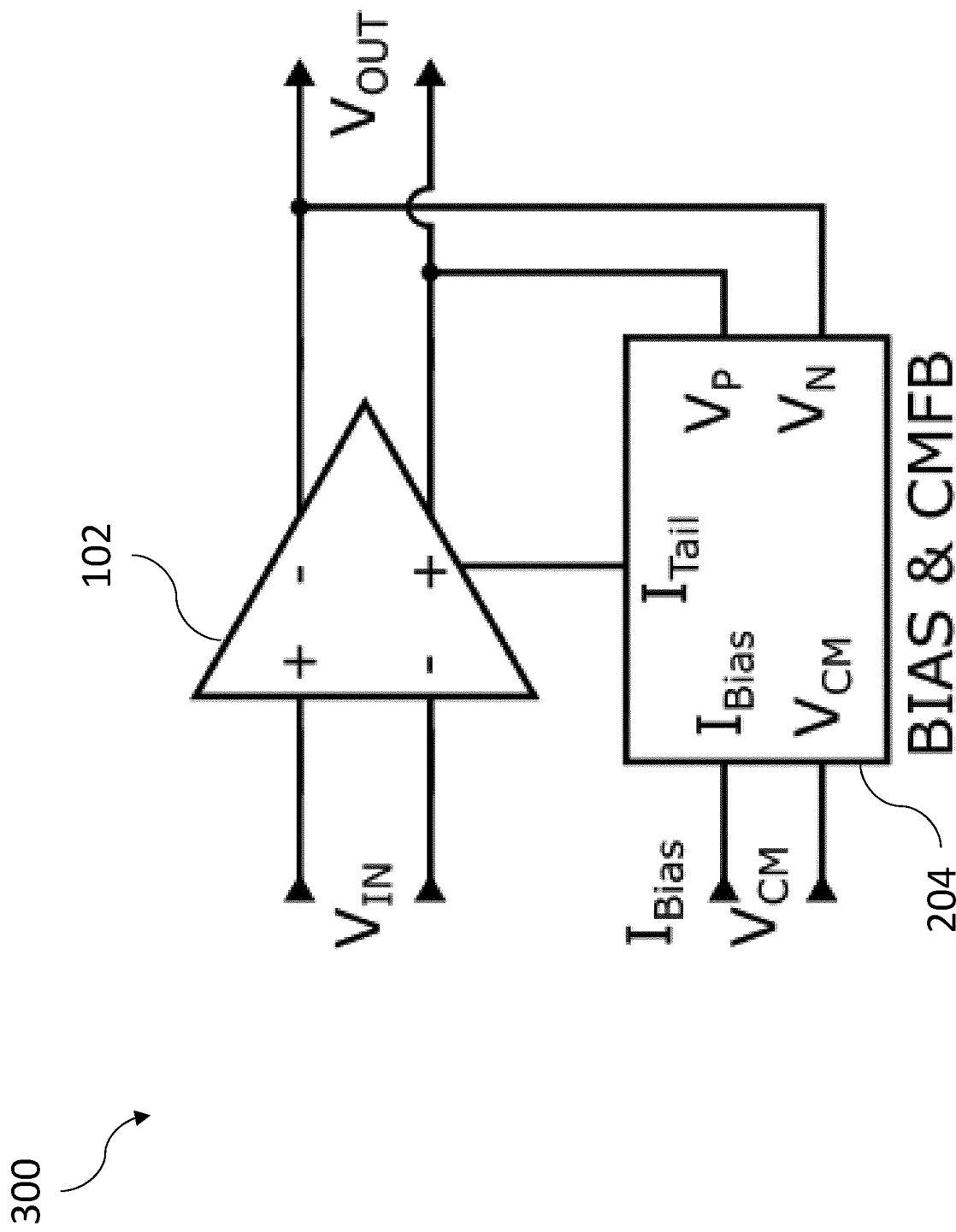
FIG. 4 is a block diagram of a fully differential amplifier that uses the common-mode feedback circuit of FIG. 3.

FIG. 3 is a schematic diagram of a CMFB circuit 204 in accordance with an embodiment of the present invention, where the CMFB 204 can be used in place of the prior art CMFB 104 of FIGS. 1 and 2 to provide its benefits to the fully differential amplifier 102, where an example of such a device 300 is shown in FIG. 4.

As can be seen in FIG. 3, the CMFB circuit 204 of the present invention includes only three transistors, rather than five. Specifically, the CMFB 204 comprises: a bias transistor $M_B$, a positive tail transistor $M_{TP}$, and a negative tail transistor $M_{TN}$, where each of these transistors is an n-type FDSOI transistor, i.e. a four-terminal transistor.

The CMFB 204 is arranged such the drain terminal of the bias transistor $M_B$ (the 'first transistor') and the gate terminals of all three transistors are connected together at a bias current terminal arranged to receive the bias current $I_{Bias}$ provided by an external current source (not shown) discussed previously.

The drain terminals of the positive tail transistor $M_{TP}$ (the 'second transistor') and the negative tail transistor $M_{TN}$ (the 'third transistor') are connected together at a tail current terminal arranged to supply the tail current $I_{Tail}$ to the fully differential amplifier 102. The source terminals of all three transistors $M_B$, $M_{TP}$, $M_{TN}$ are directly connected together.

In the embodiment of FIG. 3, the back-gate terminals of the transistors are used to provide the common-mode feedback loop. In particular, the back-gate terminal of the bias transistor $M_B$ is arranged to receive the common-mode reference voltage input $V_{CM}$. The back-gate terminal of the positive tail transistor $M_{TP}$ is arranged to receive the positive output voltage $V_P$ from the fully differential amplifier 102, and the back-gate terminal of the negative tail transistor $M_{TN}$ is arranged to receive the negative output voltage $V_N$ from the fully differential amplifier 102.

In effect, the arrangement of FIG. 3 consists only of the transistors used to form the current mirror, in which the previous 'tail transistor' $M_T$ of FIG. 2 is split into two, i.e. its function is divided across the positive tail transistor $M_{TP}$ and the negative tail transistor $M_{TN}$, where each of these tail transistors $M_{TP}$, $M_{TN}$ forms a current mirror with the bias transistor $M_B$. The back-gate terminals are then used to provide the common-mode feedback behaviour, rather than needing separate transistors as per the prior art arrangement of FIG. 2. Similarly, the role of the common-mode reference transistor $M_C$ in FIG. 2 is now performed by the bias transistor $M_B$ via its respective back-gate terminal.

Depending on the values of $V_{CM}$, $V_P$, and $V_N$, the respective threshold voltages of the bias transistor $M_B$, the positive tail transistor $M_{TP}$ and the negative tail transistor $M_{TN}$ are varied in dependence of the common-mode component of the output voltage from the fully differential amplifier 102.

Specifically, the CMFB 204 is arranged such that if the common-mode component of the voltage output of the differential amplifier 104 is approximately equal to the common-mode reference voltage $V_{CM}$, i.e. if the average of $V_P$ and $V_N$ is approximately equal to $V_{CM}$, the conductance of the two tail transistors $M_{TP}$ and $M_{TN}$ is maximised, and thus the tail current $I_{Tail}$ supplied to the fully differential amplifier 102 is maximised (i.e. the common-mode feedback loop is at its most conductive).

However, if the average of $V_P$ and $V_N$ (i.e. the common-mode output of the amplifier 102) deviates from the common-mode reference voltage $V_{CM}$, the threshold voltages of the two tail transistors $M_{TP}$ and $M_{TN}$ will increase due to the resulting back bias which reduces the conductance of these tail transistors $M_{TP}$ and $M_{TN}$, thereby reducing the tail current $I_{Tail}$ supplied to the differential pair within the fully differential amplifier 102. This reduction in current leads to a reduction in the common-mode voltage.

In this advantageous arrangement, the three FDSOI transistors—i.e. the bias transistor $M_B$, the positive tail transistor $M_{TP}$ and the negative tail transistor $M_{TN}$—are biased in their respective pentode regions. This ensures a relatively high loop gain for a wide range of values of $V_{CM}$, $V_P$, and $V_N$.

Thus it will be appreciated that embodiments of the present invention provide an improved common-mode feedback circuit for use with a fully differential amplifier that makes use of the back-gate terminals of the transistors to provide the common-mode feedback behaviour. Such an arrangement may advantageously provide reductions in power consumption and/or silicon area requirements compared to conventional arrangements that do not make use of the back biasing ability afforded by newer technology nodes (e.g. FDSOI) as per embodiments of the present invention.

While specific embodiments of the present invention have been described in detail, it will be appreciated by those skilled in the art that the embodiments described in detail are not limiting on the scope of the claimed invention.

The invention claimed is:

1. A common-mode feedback circuit for a fully differential amplifier, said common-mode feedback circuit comprising first, second, and third transistors, each having a respective drain terminal, source terminal, gate terminal, and back-gate terminal, wherein the common mode feedback circuit is arranged such that:

the drain terminal of the first transistor and the gate terminals of the first, second, and third transistors are connected together at a bias current terminal;

the drain terminals of the second and third transistors are connected together at a tail current terminal; and the source terminals of the first, second, and third transistors are connected together;

wherein the back-gate terminal of the first transistor is arranged to receive a common-mode reference voltage input, the back-gate terminal of the second transistor is arranged to receive a positive output voltage from the fully differential amplifier, and the back-gate terminal of the third transistor is arranged to receive a negative output voltage from the fully differential amplifier.

2. The common-mode feedback circuit as claimed in claim 1, wherein the first, second, and third transistors comprise fully depleted semiconductor-on-insulator (FDSOI) transistors.

3. The common-mode feedback circuit as claimed in claim 1, wherein the first, second, and third transistors comprise n-type transistors.

4. The common-mode feedback circuit as claimed in claim 1, wherein the bias current terminal is connected to a bias current supply.

5. An electronic device comprising a fully differential amplifier and a common-mode feedback circuit, wherein the fully differential amplifier comprises:

a positive input terminal and a negative input terminal arranged to receive a differential input voltage thereacross;

a positive output terminal and a negative output terminal, wherein the fully differential amplifier is arranged to produce a differential output voltage across said output terminals, wherein said differential output voltage is at least partially dependent on said differential input voltage; and a supply current terminal arranged to receive a tail current for biasing the fully differential amplifier;

wherein the common-mode feedback circuit comprises first, second, and third transistors, each having a respective drain terminal, source terminal, gate terminal, and back-gate terminal, wherein the common mode feedback circuit is arranged such that:

the drain terminal of the first transistor and the gate terminals of the first, second, and third transistors are connected together at a bias current terminal;

the drain terminals of the second and third transistors are connected together at a tail current terminal; and the source terminals of the first, second, and third transistors are connected together;

wherein the back-gate terminal of the first transistor is arranged to receive a common-mode reference voltage input, the back-gate terminal of the second transistor is connected to the positive output voltage terminal, and the back-gate terminal of the third transistor is connected to the negative output voltage terminal.

6. The electronic device as claimed in claim 5, comprising a radio communication device.

7. The electronic device as claimed in claim 5, wherein the first, second, and third transistors comprise fully depleted semiconductor-on-insulator (FDSOI) transistors.

8. The electronic device as claimed in claim 5, wherein the first, second, and third transistors comprise n-type transistors.

9. The electronic device as claimed in claim 5, wherein the bias current terminal is connected to a bias current supply.

* * * * *